US011802757B2

(12) United States Patent
Hu et al.

(10) Patent No.: US 11,802,757 B2
(45) Date of Patent: Oct. 31, 2023

(54) HETERODYNE GRATING INTERFEROMETRIC METHOD AND SYSTEM FOR TWO-DEGREE-OF-FREEDOM WITH HIGH ALIGNMENT TOLERANCE

(71) Applicant: HARBIN INSTITUTE OF TECHNOLOGY, Heilongjiang (CN)

(72) Inventors: Pengcheng Hu, Heilongjiang (CN); Di Chang, Heilongjiang (CN); Jiubin Tan, Heilongjiang (CN)

(73) Assignee: Harbin Institute of Technology, Heilongjiang (CN)

( * ) Notice: Subject to any disclaimer, the term of this patent is extended or adjusted under 35 U.S.C. 154(b) by 156 days.

(21) Appl. No.: 17/417,925

(22) PCT Filed: Apr. 18, 2019

(86) PCT No.: PCT/CN2019/083131
§ 371 (c)(1),
(2) Date: Jun. 24, 2021

(87) PCT Pub. No.: WO2020/133820
PCT Pub. Date: Jul. 2, 2020

(65) Prior Publication Data
US 2022/0090907 A1   Mar. 24, 2022

(30) Foreign Application Priority Data

Dec. 26, 2018  (CN) .......................... 201811600377.5

(51) Int. Cl.
*G01B 9/02015* (2022.01)
*G01B 9/02001* (2022.01)
*G01B 9/02003* (2022.01)

(52) U.S. Cl.
CPC ..... *G01B 9/02007* (2013.01); *G01B 9/02003* (2013.01); *G01B 9/02015* (2013.01); *G01B 9/02027* (2013.01)

(58) Field of Classification Search
CPC ........... G01B 9/02007; G01B 9/02003; G01B 9/02015; G01B 9/02027; G01B 9/02021; G01B 2290/70; G03F 7/70775
See application file for complete search history.

(56) References Cited

U.S. PATENT DOCUMENTS

| 7,196,797 | B2 * | 3/2007 | Bockman ........... | G01B 9/02049 |
| | | | | 359/489.08 |
| 7,224,466 | B2 * | 5/2007 | Ray ................... | G01B 9/02061 |
| | | | | 356/500 |
| 2005/0259268 | A1 * | 11/2005 | Schluchter ......... | G01B 9/02022 |
| | | | | 356/500 |
| 2011/0255096 | A1 * | 10/2011 | Deck ........................ | G01D 5/38 |
| | | | | 356/486 |

FOREIGN PATENT DOCUMENTS

| CN | 103604376 A | 2/2014 |
| CN | 104634254 A | 5/2015 |
| CN | 106289068 A | 1/2017 |

(Continued)

OTHER PUBLICATIONS

International Search Report for PCT/CN2019/083131 dated Sep. 17, 2019, 4 pages.

*Primary Examiner* — Jonathan M Hansen
(74) *Attorney, Agent, or Firm* — Meunier Carlin & Curfman LLC

(57) ABSTRACT

Present disclosure relates to a heterodyne grating interferometric method and system for two-degree-of-freedom with high tolerance. The system comprises a separately modulated heterodyne laser (1), an optical prism (23) and a photoelectric detection and signal processing unit (4). The separately modulated heterodyne laser (1) simultaneously (Continued)

outputs two laser beams at different frequencies, which are incident in parallel to a first beamsplitting surface so as to be split, and then a part thereof is incident to a retro-reflector (233) to produce reference beams (53*a*, 53*b*), which are incident to a third beamsplitting surface, and the other part traverses a double-diffraction structure formed by a measured grating (3) and retro-reflectors (234*a*, 234*b*) to obtain two measured beams (59*a*, 59*b*), which are incident to a second beamsplitting surface and then are divided into two parts. Wherein one part is converged to form a first interference beam (61), and the other part is incident to the third beamsplitting surface and is converged with the corresponding reference beams (53*a*, 53*b*) to form second and third interference beams (62, 63). Photoelectric detection and signal processing is performed on the interference signals of the three interference beams (61, 62, 63), so as to calculate horizontal and vertical displacement of the grating (3). The present measurement method and system improve the angular tolerance of tip and tilt of the optical grating (3) while increasing the fold factors.

12 Claims, 2 Drawing Sheets

(56) References Cited

FOREIGN PATENT DOCUMENTS

| | | |
|---|---|---|
| CN | 108627100 A | 10/2018 |
| CN | 109579694 A | 4/2019 |
| JP | 085329 A | 1/1996 |

* cited by examiner

HETERODYNE GRATING INTERFEROMETRIC METHOD AND SYSTEM FOR TWO-DEGREE-OF-FREEDOM WITH HIGH ALIGNMENT TOLERANCE

TECHNICAL FIELD

The present disclosure relates to a measuring method and system for a grating, and particularly, relates to a heterodyne grating interferometric method and system for two-degree-of-freedom with high alignment tolerance.

DESCRIPTION OF RELATED ART

A lithography machine is a core equipment in the field of integrated circuit manufacturing, and is used to align and expose a wafer. Among them, an ultra-precision wafer stage is one of core subsystems of the lithography machine, and is used for carrying the wafer to complete ultra-precise step scanning movement at a speed of meters per second with accuracy of nanometer or higher. In actual motion, the wafer stage will produce a tip and tilt of micro-radian to milli-radian and vertical offset of microns. Therefore, in order to realize the motion and positioning of the ultra-precision wafer stage, a wafer stage measuring system needs to have characteristics of high speed, high resolution, and multi-degree-of-freedom measurement. At present, a heterodyne laser interferometric system is a commonly used ultra-precision wafer stage measuring program. However, with the continuous improvement of measuring accuracy, measuring distance, measuring speed and other motion indicators, it is difficult for a dual-frequency laser interferometer to satisfy measuring requirements due to inconvenience such as high environmental sensitivity and large space occupied by multi-degree-of-freedom layout.

With respect to the above inconvenience, various companies and research institutions in the field of ultra-precision measurement across the world have launched a series of studies. One of main research directions is the heterodyne grating interferometer. Research results are disclosed in many patents and papers. Chinese patents of Tsinghua University, CN103307986A (published on Sep. 18, 2013) and CN105823422A (published on Aug. 3, 2016) respectively disclose a system and method for measuring two-degree-of-freedom displacement using heterodyne grating interferometer, which can measure a large-stroke displacement in the horizontal direction and a displacement in the vertical direction at the same time. However, since the dual-frequency laser is coaxial and is separated into a reference beam and a measurement beam with the use of a polarizing beam splitter, the above technical solutions have problems of optical frequency mixing, polarization mixing, and corresponding periodic non-linear errors caused by incomplete polarizing beamsplitting. The US patent US2013/114062A1 (published on May 9, 2013) of ZYGO of the United States discloses a compact encoder head for interferometric encoder system, which uses a monolithic optical prism instead of discrete corner-cube prisms to realize a double-diffracted optical configuration with a fold factor of 4 and has characteristics of compact structure, high-fold-factor and high-alignment-tolerance, but only performs in-plane displacements measurement and cannot achieve vertical measurement; moreover, it leads to the problems of optical frequency mixing, polarization mixing, and corresponding periodic non-linear errors caused by incomplete polarizing beamsplitting of dual-frequency laser. The Chinese patent CN105203031A (published on Dec. 30, 2015) of the Shanghai Institute of Optics and Fine Mechanics, Chinese Academy of Sciences discloses a two-axis heterodyne grating interferometer with fold factor of 4. Its system uses a dual-frequency laser beam which is split into two parts and enters into two Agilent N10715A interferometric modules placed in a Littrow structure respectively, so as to realize the double-pass measurement of the displacement of the grating in the horizontal and vertical directions. However, the system also has the problems of optical frequency mixing, polarization mixing, and corresponding periodic non-linear errors caused by incomplete polarizing beamsplitting.

The Chinese patent CN103604376A of Harbin Institute of Technology (published on Feb. 26, 2014) discloses an anti-optical-mixing three-degree-of-freedom heterodyne grating interferometric method and system, which uses separately modulated dual-frequency laser sources to avoid the influence caused by the above-mentioned incomplete polarizing beamsplitting, and realizes three-degree-of-freedom measurement. However, the 2-fold-factor method has a lower resolution and a lower angular tolerance to the tip and tilt of the grating. The Chinese patent CN106289068A (published on Jan. 4, 2017) of Tsinghua University discloses a two-degree-of-freedom heterodyne grating interferometer displacement measurement method, which uses separately modulated dual-frequency laser sources and a Littrow optical structure to achieve the measurement of the displacement of the grating in the horizontal and vertical directions and has characteristics of anti-optical-mixing and miniaturization; however, the differential Littrow structure of this technical solution can only realize the horizontal displacement of the grating with a fold factor of 2. Besides, in this structure, the laser source is relatively close to the optical prism, and will generate heat to cause a certain thermal drift; and the laser beam is transmitted in space, and thus has high requirements on assembly and alignment. The above researches show that the existing technology has not yet taken into account the characteristics of anti-optical-mixing, high-fold-factor and high-alignment-tolerance, and a further research is still needed to better satisfy the increasing demand for measuring systems in application environments such as lithography machines.

SUMMARY OF THE INVENTION

The technical problem to be solved by the present disclosure is to overcome the shortcomings of the prior art, and the present invention seeks for a heterodyne grating interferometric method which not only prevent optical-mixing but also works with high alignment tolerance. The measurement method can achieve sub-nanometer or even higher resolution, can simultaneously measure the horizontal (in-plane) displacement and vertical (out-of-plane) displacement of the grating with a fold factor of 4, can take into account the high tolerance characteristics of the tip and tilt of the grating, and avoid the heating effect of the laser source and reduce the alignment requirements of the grating reading head during the assembly. The measurement system is applied to the lithography machine, can realize the multi-degree-of-freedom, fast and ultra-precision displacement measurement of the ultra-precision wafer stage, and significantly improve the performance of the wafer stage.

The object of the present disclosure is achieved as follows.

According to a first aspect, the present disclosure provides a heterodyne grating interferometric method for two-degree-of-freedom with high alignment tolerance. A heterodyne laser may output two laser beams at the same time, wherein a first laser beam and a second laser beam are at a first frequency and a second frequency respectively. The first laser beam and the second laser beam are spatially separated and transmitted to a first beamsplitting surface to obtain corresponding reference beams and measuring beams. The two reference beams pass through the retro-reflector structure to form a first reference beam and a second reference beam, and is incident on a third beamsplitting surface. The two measuring beams are incident on the measured grating perpendicularly, pass through a secondary diffraction structure formed by the grating and retro-reflector to obtain corresponding first measuring beam and second measuring beam, and are divided into two parts by a second beamsplitting surface, one part thereof passes through a lateral displacement beamsplitter to form a first interference beam, and the other part thereof is incident on a third beamsplitting surface. On the third beamsplitting surface, the first reference beam and the second measuring beam, the second reference beam and the first measuring beam respectively converge to form a second interference beam and a third interference beam, the three interference beams each produce optical beat frequency interference signals, which are detected and processed to obtain horizontal and vertical displacements information of the measured grating.

According to a second aspect, the present disclosure provides a heterodyne grating interferometric system for two-degree-of-freedom with high alignment tolerance, which may comprise a laser source module which can emit two laser beams at different frequencies and an optical prism. Wherein, a first laser beam is transmitted to the grating reading head through the first single-mode polarization-maintaining fiber to form the first incident laser beam; the other laser beam is transmitted to the grating reading head through the second single-mode polarization-maintaining fiber to form the second incident laser beam; the polarization states of the two incident laser beams are adjusted, so that the reflected beams of the polarizing beamsplitter form a first reference beam and a second reference beam. A retro-reflector with an adequate aperture is placed on the optical path of the reference beams, such that reference beams cross to produce a certain offset and exit in parallel in the opposite directions. The two incident laser beams correspondingly form a first measuring beam and a second measuring beam on the transmission side of the beamsplitting surface of the polarizing beamsplitter, wherein the two measuring beams are incident on the grating and diffracted for the first time so as to produce the first diffracted beams at all orders, the +1-order diffracted beam of the first measuring beam and the −1-order diffracted beam of the second measuring beam are selected, and each is provided with a retro-reflector bonded to the optical prism on each of their optical paths, such that the selected two first-diffracted beams produce a certain spatial deviation and then exit in parallel and opposite directions, and then diffract at the grating again to produce the second diffraction, wherein the (+1,+1)-order diffracted beam of the first measuring beam and the (−1,−1)-order diffracted beam of the second measuring beam are parallel and opposite to the first and second measuring beams. A part of the two second diffracted beams is obtained by means of reflection by a non-polarizing-beamsplitting surface and then pass through a lateral displacement beamsplitter to obtain the first interference beam. The other transmitted portions of the first diffracted beam and the second diffracted beam are converged with the second reference beam and the first reference beam respectively on the above polarizing-beamsplitting surface so as to produce a second interference beam and a third interference beam. The above three interference beams respectively pass through the analyzers to produce interference, are transmitted through the multi-mode fiber, and are finally directed to the corresponding three photodetectors. The above photodetectors convert the beat frequency signals into electric signals, which are then sent by the wire to the signal processing unit to complete the signal processing and the calculation of the measured displacement.

Compared with the prior art, the advantages of the present invention are as follows.

(1) In the present disclosure, a double diffraction structure is used to simultaneously obtain the measurements of horizontal motion of the grating with a fold factor of 4 and the vertical movement of the grating with higher fold factors, thus improving measurement resolution.

(2) In the present disclosure, the (+1, +1)-order and (−1, −1)-order diffracted beams of the second diffraction of the two measuring beams are used to measure the vertical movement of the grating, which avoids the problem of angular mismatch caused by the tip and tilt of the grating using the 0th-order diffracted beam of the first diffraction of the two measuring beams. The angular mismatch of the first diffracted beam is converted into the position mismatch of the second diffracted beam, which ensures the sufficient relative signal of the interference beam, and significantly improves the tolerance to the tip and tilt of the grating.

(3) In the present disclosure, the optical interference beat signals including both the horizontal and the vertical displacements are decoupled to obtain the specific displacements, which improves the energy utilization of the measuring beams.

Figure 1:
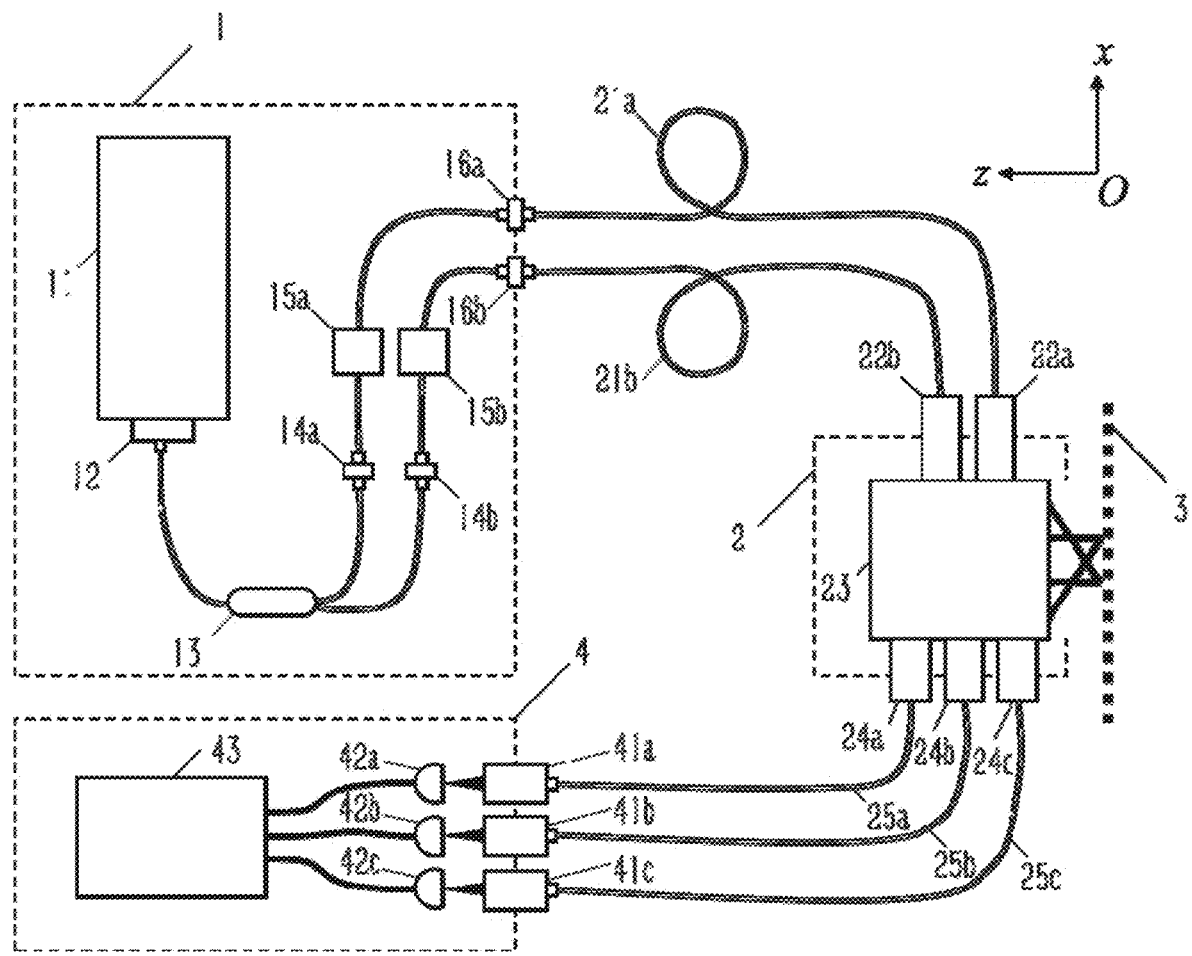
FIG. 1 is a schematic structural diagram of a heterodyne grating interferometric system for two-degree-of-freedom with high alignment tolerance.

In the Figures: 1—separately modulated heterodyne laser, 11—single-frequency laser, 12—spatial beam and fiber coupler, 13—polarization maintaining fiber 1×2 beam splitter; 14a, 14b—fiber optic adapter; 15a, 15b—fiber optic acousto-optic modulator; 16a, 16b—fiber optic adapter, 2—grating reading head; 21a, 21b—polarization maintaining single-mode fiber; 22a, 22b—fiber collimator with a polarizer, 23—optical prism; 24a, 24b, 24c—fiber coupler with a analyzer; 25a, 25b, 25c—multimode fiber; 3—reflection grating; 41a, 41b, 41c—cage structure; 42a, 42b, 42c—photodetector; 43—signal processing board; 231a, 231b—incident beam reflecting prism; 232—central beamsplitting prism with both polarizing beamsplitting surface and non-polarizing-beamsplitting surface; 233—corner-cube prism; 234a, 234b—pentagonal corner-cube prism; 235—lateral displacement beamsplitter; 236a, 236b—interference beam reflecting prism; 51 to 59—each beam generated by a first incident beam; 51a to 59a—each beam generated by a second incident beam; 61, 62, 63—interference beam.

DETAILED DESCRIPTION OF EMBODIMENTS

The specific embodiments of the present invention will be further described in detail below in conjunction with the accompanying drawings.

A heterodyne grating interferometric method for two-degree-of-freedom with high alignment tolerance is disclosed. A heterodyne laser outputs two laser beams simultaneously, wherein a first laser beam and a second laser beam are at a first frequency and a second frequency respectively, and are spatially separated and transmitted to a first beamsplitting surface to obtain corresponding reference beams and measuring beams. The two reference beams pass through the retro-reflector structure to form a first reference beam and a second reference beam, and is incident on a third beamsplitting surface. The two measuring beams are incident on the measured grating perpendicularly, pass through a secondary diffraction structure formed by the grating and retro-reflectors to obtain corresponding first measuring beam and second measuring beam, and are divided into two parts by passing through a second beamsplitting surface, one part thereof passes through a lateral displacement beamsplitter to form a first interference beam, and the other part thereof is incident on a third beamsplitting surface. On the third beamsplitting surface, the first reference beam and the second measuring beam, the second reference beam and the first measuring beam respectively converge to form a second interference beam and a third interference beam. Optical beat frequency signals of the three interference beams each are detected and processed to obtain horizontal and vertical displacements of the measured grating.

In some embodiments, in the heterodyne grating interferometric method for two-degree-of-freedom with high alignment tolerance, the first, the second and the third beamsplitting surfaces can be realized by three different beamsplitting surfaces, or can be realized by two beamsplitting surfaces or one beamsplitting surface. The specific beamsplitting surface can be configured as a polarizing beamsplitting surface or a non-polarizing beamsplitting surface according to the actual optical structure.

Figure 2:
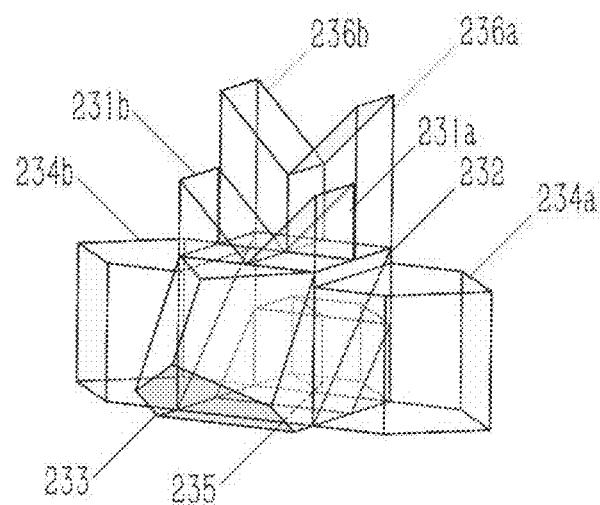
FIG. 2 is a schematic structural diagram of the prism of a grating reading head of the present invention.
Figure 3:
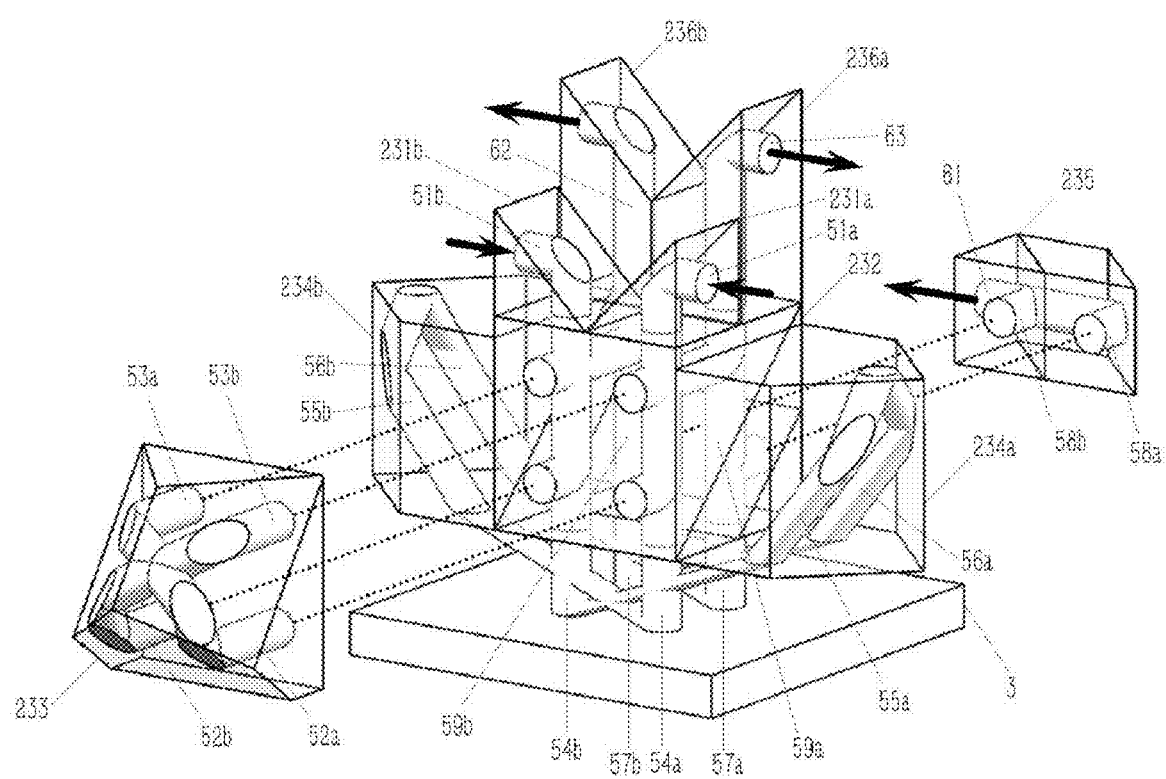
FIG. 3 is a schematic diagram of a spatial beam path in the structure of the prism in FIG. 2. In the figure, an exploded view is appropriately processed for some optical components to clearly express each spatial beam path in the optical prism.

A heterodyne grating interferometric system for two-degree-of-freedom with high alignment tolerance is disclosed. Please refer to FIGS. 1-3, a spatial beam is emitted by the single-frequency laser 11, coupled into the polarization-maintaining fiber through the coupler 12, and then divided into a first beam and a second beam by a 1×2 fiber optic beamsplitter 13. The first beam and second beam respectively enter into fiber acousto-optic modulators 15a and 15b with different modulation frequencies through fiber optic adapters 14a and 14b. After modulation, the first beam and the second beam are respectively at the first frequency and the second frequency, enter into polarization-maintaining fibers 21a and 21b through fiber optic adapters 16a and 16b, and are adjusted to 45-degree circularly polarized collimated spatial beams by fiber collimators 22a and 22b with polarizers, which are named as the first incident beam 51a and the second incident beam 51b and enters into an optical prism 23. The first incident beam 51a and the second incident beam 51b are first converted by incident beam reflecting prisms 231a and 231b into a direction vertical to grating plane, and pass through polarizing-beamsplitting surface of a central beamsplitting prism 232 to be divided into a first reflected beam 52a, a second reflected beam 52b, a first transmitted beam 54a and a second transmitted beam 54b. The two reflected beams 52a and 52b are cross-shifted after passing through the retro-reflector structure to obtain a first reference beam 53a and a second reference beam 53b. And on the other hand, the transmitted beams are incident on a grating 3 perpendicularly to undergo a first diffraction, produce +1-order diffracted beam 55a of the first transmitted beam and −1-order diffracted beam 55b of the second transmitted beam, are refracted by a bottom surface of pentagonal prism retro-reflector structures 234a and 234b and are reflected three times by side surfaces and top surface of the pentagonal prism retro-reflector structures 234a and 234b, so as to obtain offset first and second retro-reflected beams 56a and 56b, which are obliquely incident on the grating 3 after through the refraction surface again to undergo a second diffraction, so as to produce a first (+1, +1)-order double-diffracted beam 57a and a second (−1, −1)-order double-diffracted beam 57b, which emit perpendicular to the grating, then the double-diffracted beams 57a and 57b enter into the central beamsplitting prism 232 again and are split through non-polarizing-beamsplitting surfaces of the central beamsplitting prism. The reflected parts 58a and 58b thereof are incident on the lateral displacement beamsplitter 235 to produce a first interference beam 61. The transmitted parts thereof are named as a first measuring beam 59a and a second measuring beam 59b and pass through the polarization beamsplitting surface of the central beamsplitting prism again, here, the second measuring beam 59b and the first reference beam 53a, the first measuring beam 59a and the second reference beam 53b are converged to produce a second interference beam 62 and a third interference beam 63, respectively, which pass through the interference beam reflecting prisms 236a and 236b to be adjusted to emit in a direction parallel to the grating; so far, the three interference beams 61, 62, and 63 respectively enter into fiber couplers 24a, 24b, and 24c with analyzers to interfere and be coupled into multi-mode fibers 25a, 25b, 25c respectively, and then respectively enter into cage structures 41a, 41b, and 41c containing convergent fiber collimators after being transmitted through the multi-mode fibers, such that the light beams are respectively focused on the surface of photodetectors 42a, 42b, 42c, collected and amplified, and then transmitted to a signal processing board 43 through wires for displacement calculation, to obtain horizontal and vertical displacement information.

In some embodiments, in the heterodyne grating interferometric system for two-degree-of-freedom with high alignment tolerance, the beams 55a and 55b can respectively represent +1-order diffracted light of the first transmitted beam and −1-order diffracted beam of the second transmitted beam, or can be configured to respectively represent −1-order diffracted beam of the first transmitted beam and +1-order diffracted beam of the second transmitted beam. Correspondingly, the reference beam is reflected back to the measured grating via the retro-reflectors 234a and 234b placed on the optical path of the beams 55a and 55b to undergo a double-diffraction, and the vertically emitted double-diffracted beams 57a and 57b correspond to a first (+1, +1)-order double-diffracted beam and a second (−1, −1)-order double-diffracted beam, or a first (−1, −1)-order double-diffracted beam and a second (+1, +1)-order double-diffracted beam.

In some embodiments, in the heterodyne grating interferometric system for two-degree-of-freedom with high alignment tolerance, the separately modulated heterodyne laser source module 1 can be a fiber transmission structure or a spatial beam structure. That is to say, the splitting part of a single-frequency laser beam can be realized by a fiber optic beamsplitter or a spatial beamsplitting prism; the frequency modulation part thereof can be realized by fiber acousto-optic modulator or spatial acousto-optic modulator.

In some embodiments, in the heterodyne grating interferometric system for two-degree-of-freedom with high alignment tolerance, the incident beam reflecting prisms 231a and 231b and the interference beam reflecting prisms 236a and 236b can be realized by reflecting prisms or mirrors.

In some embodiments, in the heterodyne grating interferometric system for two-degree-of-freedom with high alignment tolerance, the central beamsplitting prism 232 can be realized by a special monolithic prism containing the polarizing-beamsplitting surfaces and non-polarizing-beamsplitting surfaces, or a combination of discrete beamsplitting prisms.

In some embodiments, in the heterodyne grating interferometric system for two-degree-of-freedom with high alignment tolerance, the retro-reflector 233 of the reference beam can be realized by a retro-reflector structure such as a corner-cube prism or a combination of a convergent lens and a mirror.

In some embodiments, in the heterodyne grating interferometric system for two-degree-of-freedom with high alignment tolerance, the measuring beam retro-reflectors 234a, 234b can be realized by a retro-reflector structure such as any one of standard corner-cube prism element, a prism equivalent to a corner-cube prism or a square mirror, or a combination of convergent lens and a mirror.

In some embodiments, in the heterodyne grating interferometric system for two-degree-of-freedom with high alignment tolerance, the grating 3 can be reflective or transmissive, and can be a linear grating or a planar grating, etc. When the grating is the reflective grating, the measuring beam retro-reflectors 234a, 234b are on the same side of a surface of the grating as the other elements of an optical prism. When the grating is the transmissive grating, the measuring beam retro-reflectors 234a, 234b and the other elements of the optical prism are on two sides of the surface of the grating respectively.

In some embodiments, in the heterodyne grating interferometric system for two-degree-of-freedom with high alignment tolerance, the incident beam reflecting prisms 231a, 231b, the reference beam retro-reflector 233, the measuring beam retro-reflectors 234a, 234b, the lateral displacement beamsplitter 235, the interference beam reflecting prisms 236a, 236b can be directly bonded to the central beamsplitting prism 232 or bonded to it through an optical positioning part to form a monolithic prism (i.e., an integral optical prism) and can be fixed through the central beamsplitting prism 232 bonded to a mechanical housing, or directly bonded to the mechanical housing in a form of multiple discrete prisms for fixing.

In some embodiments, in the heterodyne grating interferometric system for two-degree-of-freedom with high alignment tolerance, the detection of the optical beat frequency signals by the photodetectors 41a, 41b and 41c can be implemented by means of direct detection of the spatial beam by the photodetector, or remote reception by the fiber coupler and transmission to the photodetector for detection.

It may be assumed that the frequency of the first beam output by the separately modulated heterodyne laser source module 1 is $f_1$, the frequency of the second beam is $f_2$, and $f_1 > f_2$.

When the grating 3 is stationary, reflected beams 58a and 58b of the central beamsplitting prism, the first reference beam 53a and the second measuring beam 59b, the second reference beam 53b and the first measuring beam 59a produce interferometric beat-frequency signal, and the beat frequency thereof is $f_1 - f_2$, that is, the difference between the modulation frequencies of the acousto-optic modulators 15a and 15b in the separately modulated heterodyne laser source module 1.

When the grating 3 produces horizontal and vertical motion, it may be assumed that the Doppler frequency shift caused by horizontal motion and vertical motion are $f_x$ and $f_z$ respectively, at this time, the frequency of the first reference beam 53a is still $f_1$, the frequency of the second reference beam 53b is still $f_2$, and the frequency of the first (+1, +1)-order double-diffracted beam 57a containing the Doppler frequency shift, the reflected beams 58a through the central beamsplitting prism, and the transmitted first measuring beam 59a is $f_1 + 2f_x + kf_z$; the frequency of the second (−4, −1)-order double-diffracted beam 57b containing the Doppler frequency shift, the reflected beams 58b through the central beamsplitting prism, and the transmitted second measuring beam 59b is $f_2 - 2f_x + kf_z$, k in the formula is the Doppler frequency shift coefficient in the vertical direction.

According to the geometrical relationship of the beam, there is $k = 1 + 1/\cos\theta$, θ is a diffraction angle, which can be calculated based on the grating equation for normal incidence.

Therefore, the frequency of the first interference beam 61 is $f_1 - f_2 + 4f_x$; the frequency of the second interference beam 62 is $f_1 - f_2 + 2f_x - kf_z$; the frequency of the third interference beam 63 is $f_1 - f_2 + 2f_x + kf_z$.

In the signal processing board 43, the interference signals corresponding to the first interference beam 61 and the second interference beam 62 are demodulated to obtain a first demodulation signal with a frequency of $2f_x + kf_z$; the interference signals corresponding to the first interference beam 61 and the third interference beam 63 are demodulated to obtain a second demodulation signal with a frequency of $2f_x - kf_z$; the interference signals corresponding to the second interference beam 62 and the third interference beam 63 are demodulated to obtain a third demodulation signal with a frequency of $2kf_z$: the first demodulation signal and the second demodulation signal are demodulated again to obtain a secondary demodulation signal with a frequency of $4f_x$.

Phase calculation may be performed for the third demodulation signal and the secondary demodulation signal, so as to respectively obtain the horizontal displacement of the grating under optical configuration with fold factor of 4 and the vertical displacement of the grating under an optical subdivision with even higher fold factors.

The invention claimed is:

1. A heterodyne grating interferometric method for two-degree-of-freedom with high alignment tolerance, comprising:

transmitting, by a heterodyne laser, a first laser beam at a first frequency and a second laser beam at a second frequency at the same time in a spatially separated manner to a first beamsplitting surface to obtain two corresponding reference beams and two primary measuring beams;

passing the two corresponding reference beams pass through a first retro-reflector to form a first reference beam and a second reference beam and making the first reference bean and the second reference beam incident on a third beamsplitting surface;

making the two primary measuring beams incident on a target grating perpendicularly, an passing the two primary measuring beams through a double-diffraction structure formed by the target grating and a second retro-reflector and a third retro-reflector to obtain the corresponding first measuring beam and second measuring beam; dividing the first measuring beam and the second measuring beam into two parts by a second beamsplitting surface, passing one part of the two parts through a lateral displacement beamsplitter to form a first interference beam, meanwhile making another part of the two parts incident on the third beamsplitting surface;

converging on the third beamsplitting surface, the first reference beam and the second measuring beam, as well as the second reference beam and the first measuring beam, respectively, to form a second interference beam and a third interference beam;

generating optical beat frequency signals by each of the first interference beam, the second interference beam, and the third interference beam, respectively, obtaining horizontal and vertical displacement information of the target grating via photoelectric detection and signal processing on the optical beat frequency signals.

2. The heterodyne grating interferometric method for two-degree-of-freedom with high alignment tolerance and anti-aliasing according to claim 1, wherein the first beamsplitting surface. the second beamsplitting surface, and the third beamsplitting surface are realized by three different beamsplitting surfaces, or can be are realized by two beamsplitting surfaces or are realized by one beamsplitting surface.

3. A heterodyne grating interferometric system for two-degree-of-freedom with high alignment tolerance, comprising a separately modulated heterodyne laser source module, fiber optic adapters provided thereon polarization-maintaining fibers, an optical prism, fiber collimators with polarizers, and fiber couplers, each provided on the optical prism, a target grating, multi-mode fibers, a photodetector and a signal processing module, wherein the polarization-maintaining fibers are coupled between the fiber optic adapters and the fiber collimators, respectively.

the multi-mode fibers are coupled with the fiber couplers, respectively, the heterodyne laser source module comprising a single-frequency laser, a coupler, a 1×2 fiber optic beamsplitter, fiber optic adapters, and fiber acousto-optic modulators with a first modulation frequency and a second modulation frequency different from each other, wherein, a spatial beam from the single-frequency laser is coupled through the coupler to the 1×2 fiber optic beamsplitter, which divides the spatial beam into a first beam and a second beam, the first beam and the second beam respectively enter into fiber acousto-optic modulators through the fiber optic adapters for modulation, then enter respectively into the polarization-maintaining fibers through the fiber optic adapters;

the optical prism comprising a prism. which comprising incident beam reflecting prisms, a central beamsplitting prism, a first retro-reflector, a second and third retro-reflectors, a lateral displacement beamsplitter, and interference beam reflecting prisms, wherein, the fiber collimators are configured to collimate and polarize ovally or circularly the first beam and the second beam delivered from the polarization-maintaining fibers, so as to obtain a first incident beam and a second incident beam, both of which enters into the incident beam reflecting prisms, which convert them into a direction perpendicular to the target grating, the first incident beam and the second incident beam, upon the conversion, pass through a polarizing-beam-splitting surface of the central beamsplitting prism, so as to be divided into a first reflected beam, a second reflected beam, a first transmitted beam and a second transmitted beam, the first retro-reflector is configured to cross-shift the two reflected beams by passing them through, so as to obtain a first reference beam and a second reference beam, the first transmitted beam and the second transmitted beam are incident on the target grating perpendicularly to undergo a first diffraction, so as to produce a +1-order diffracted beam and a -1-order diffracted beam of the first transmitted beam and the second transmitted beam. which enter the second and third retro-reflectors respectively, so as to obtain first and second retro-reflected beams with offsets with respect to the -order diffracted beam and the −1-order diffracted beam, respectively, the first and second retro-reflected beams are then again obliquely incident on the target grating to undergo a second diffraction, so as to produce a first (+1, +1)-order double-diffracted beam and a second (−1)-order double-diffracted beam exited from the target grating perpendicularly, then the double-diffracted beams enter into the central beamsplitting prism again and are split through its non-polarizing-beamsplitting surfaces, containing reflected parts and transmitted parts, the reflected parts of the double-diffracted beams are incident on the lateral displacement beamsplitter to produce a first interference beam, while the transmitted parts of the double-diffracted beams form a first measuring beam and a second measuring beam, the first measuring beam and a second measuring beam pass through the polarizing beamsplitting surface of the central beamsplitting prism, where the second measuring beam and the first reference beam, as well as the first measuring beam and the second reference beam, are converged to produce a second interference beam and a third interference beam, respectively, each of which passes through the interference beam reflecting prisms respectively to be adjusted to emit in a direction parallel to the target grating, the fiber couplers are configured to receive the three interference beams respectively, and couple the same into the multi-mode fibers correspondingly;

the heterodyne grating interferometric system further comprises: cage structures, and containing convergent fiber collimators, photodetectors, and a signal processing board configured to obtain horizontal and vertical displacement information of the target grating.

4. The heterodyne grating interferometric system for two-degree-of-freedom with high alignment tolerance according to claim 3, the +1-order diffracted beam and the −1-order diffracted beam represent +1-order diffracted beam of the first transmitted beam and -1-order diffracted beam of the second transmitted beam, respectively, or represent −1-order diffracted beam of the first transmitted beam and +1-order diffracted beam of the second transmitted beam, respectively.

5. The heterodyne grating interferometric system for two-degree-of-freedom with high alignment tolerance according to claim 3, wherein the 1×2 fiber optic beamsplitter is replaced with a spatial beamsplitting prism and the fiber acousto-optic modulators are replaced with acousto-optic frequency shifters.

6. The heterodyne grating interferometric system for two-degree-of-freedom with high alignment tolerance according to claim 3, the incident beam reflecting prisms and the interference beam reflecting prisms are realized by reflecting prisms or mirrors.

7. The heterodyne grating interferometric system for two-degree-of-freedom with high alignment tolerance according to claim 3, the central beamsplitting prism is realized by a special monolithic beamsplitting prism containing the polarizing-beamsplitting surfaces and non-polarizing-beamsplitting surfaces, or a combination of discrete beamsplitting prisms.

8. The heterodyne grating interferometric system for two-degree-of-freedom with high alignment tolerance and anti-aliasing according to claim 3, wherein the first retro-reflector of the reference beam is realized by a retro-reflector structure including a corner-cube prism or a combination of a convergent lens and a mirror.

9. The heterodyne grating interferometric system for two-degree-of-freedom with high alignment tolerance according to claim 3, wherein the second retro-reflector and the third retro-reflector are realized by a retro-reflector structure comprising a standard corner-cube prism element, or a prism equivalent to a corner-cube prism or a square mirror, or a combination of a convergent lens and a mirror.

10. The heterodyne grating interferometric system for two-degree-of-freedom with high alignment tolerance according to claim 3, the incident beam reflecting prisms, the first retro-reflector the second and third retro-reflectors, the lateral displacement beamsplitter, the interference beam reflecting prisms are bonded to the central beamsplitting prism directly through an optical positioning part so as to form an integral optical prism to be fixed through the central beamsplitting prism bonded to a mechanical housing, or bonded to the mechanical housing in a form of multiple discrete prisms for fixing.

11. The heterodyne grating interferometric system for two-degree-of-freedom with high alignment tolerance according to claim 3, the target grating is a reflective or transmissive grating, and/or is a linear grating or a planar grating.

12. The heterodyne grating interferometric system for two-degree of-freedom with high alignment tolerance according to claim 3, wherein the photodetectors (42*a*, 42*h* and 42*c*) is configured to detect the optical beat frequency signals via direct detection of the spatial beam by the photodetector or remote reception by the fiber couplers and then transmission to the photodetector.

\* \* \* \* \*